United States Patent [19]

Davis

[11] Patent Number: 5,708,791
[45] Date of Patent: Jan. 13, 1998

[54] SYSTEM AND METHOD FOR DETECTING THE DRAM ARCHITECTURE IN A COMPUTER

[75] Inventor: Ian E. Davis, Fremont, Calif.

[73] Assignee: National Semiconductor Corporation, Santa Clara, Calif.

[21] Appl. No.: 595,606

[22] Filed: Feb. 2, 1996

[51] Int. Cl.$^6$ .............................. G06F 12/02; G06F 11/00
[52] U.S. Cl. .............. 395/432; 395/497.01; 395/183.18; 395/401
[58] Field of Search ...................................... 395/432, 433, 395/497.01, 497.02, 183.06, 183.09, 183.18, 401

[56] References Cited

U.S. PATENT DOCUMENTS

| | | |
|---|---|---|
| 5,175,835 | 12/1992 | Beighe et al. ........................ 395/432 |
| 5,423,028 | 6/1995 | Schieve et al. ..................... 395/183.18 |
| 5,568,651 | 10/1996 | Medina et al. .......................... 395/432 |

*Primary Examiner*—Eddie P. Chan
*Assistant Examiner*—Reginald G. Bragdon
*Attorney, Agent, or Firm*—Limbach & Limbach L.L.P.

[57] ABSTRACT

A system and method cause the computer to automatically detect whether the computer implements a DRAM, and, if so, the architecture of the DRAM. More particularly, the system and method determine the requisite READ protocol for implementing the DRAM, and thus determine whether the DRAM implements a fast page (FP) architecture, an extended data out (EDO) architecture, or a burst extended data out (BEDO) architecture, since each architecture implements a unique READ protocol. From the analysis, the system and method determine if the DRAM is faulty, nonexistent, or of an unknown type. If the DRAM is faulty or of an unknown type, the system and method disable the DRAM.

24 Claims, 6 Drawing Sheets

| read/write clock cycles | Address | Data Written ← 1 | Data if BEDO ← 2 | Data if FP/EDO ← 3 | Data if Faulty, Unknown, or Nonexistent ← 4 |
|---|---|---|---|---|---|
| 1 | 0 | FFFF | <garbage> | FFFF | not FFFF |
| 2 | 4 | AAAA | FFFF | AAAA | neither FFFF nor AAAA |
| 3 | 8 | 5555 | AAAA | 5555 | neither AAAA nor 5555 |
| 4 | C | 0000 | 5555 | 0000 | neither 5555 nor 0000 |

FIG. 4

SYSTEM AND METHOD FOR DETECTING THE DRAM ARCHITECTURE IN A COMPUTER

BACKGROUND OF THE INVENTION

1. Field of the Invention

This invention relates generally to Dynamic Random Access Memory (DRAM), and more particularly to an improved system and method for automatically detecting the architecture of a DRAM used in a computer.

2. Description of the Background Art

DRAM technology is used extensively in computer main memory and frame buffer memory. DRAM devices provide higher bit densities on integrated circuit chips and are easier to manufacture than static memory devices. Moreover, DRAM uses high-impedance, low power and low heat dissipation MOS transistors. Disadvantages of DRAM over static devices are the need to refresh DRAM and its slower operating speed.

A conventional DRAM includes an array of addressable data storage locations, a plurality of address input lines, and a plurality of data input and output lines. Data is written to or read from the DRAM by sending a row address of a selected row in the array, and sending a column address of a selected column in the array. The row address is strobed in by a row address strobe (RAS) signal, and the column address is strobed in by a column address strobe (CAS) signal. READ and WRITE operations are also selected during the column address strobe.

Advanced DRAM devices are constructed according to one of several architectures. Common architecture types include Fast Page (FP), Extended Data Out (EDO), Burst Extended Data Out (BEDO), and Synchronous Data (SDRAM) architectures. The architectures operate according to similar WRITE and refresh protocols, but different READ protocols. During a READ operation of an FP-type or an EDO-type DRAM while the CAS signal is asserted, the DRAM drives data out. When the CAS signal is de-asserted, the FP-type DRAM stops driving data out, while the EDO and BEDO-type DRAM continues driving data out until the RAS signal also is de-asserted or until the WRITE-ENABLE signal is toggled. The elimination of CAS output control in the EDO-type DRAM allows pipelining READs. EDO and BEDO-type DRAMs are faster, but no more expensive to manufacture, than FP-type DRAMs.

BEDO-type DRAM is a burst READ EDO-type DRAM that performs a burst of four READs for each memory address applied by the CPU. According to the BEDO READ protocol, the DRAM column address of the first of the four words to be burst read is treated as a lead-off signal, and latched in by the BEDO-type DRAM on a first clock cycle. The BEDO-DRAM releases the first data signal on the next clock cycle, and then on succeeding clock cycles internally increments the two least significant bits of the column address to produce successive addresses for the following three data signals of the burst sequence. BEDO-type DRAMs are faster than FP-type and EDO-type DRAMs.

SDRAM-type DRAM is also a burst READ type DRAM, but is accessed differently from BEDO-type. SDRAMs use a separate clock signal to sample each input (RAS/CAS). This permits better control over signal quality, and reduces problems with physical placement and layout of the DRAMs. Performance with SDRAM should be the same as with BEDO-type DRAM. However, SDRAM requires synchronous interface which increases the size and cost of the SDRAM. Careful selection of the type of DRAM architecture is important in balancing cost, availability and performance of a computer.

Computers typically employ a single architecture type of DRAM, which, to operate, needs only one DRAM program containing appropriate DRAM protocol routines. Changing to or adding a new DRAM architecture in a computer requires re-programming or replacing the DRAM program, so that the proper READ, WRITE, and refresh protocols can be implemented for the new DRAM. However, some computers have multiple types of DRAMs, which means the computer must be arranged for the proper DRAM programs to run the respective DRAMs. Mixed-type DRAM banks must be assembled in an exact order, or they will be subjected to inapplicable protocol routines. Because previous systems do not automatically detect the architecture of a DRAM used in a computer system, it is not possible to upgrade the DRAM to a different architecture without upgrading the program for operating it. Reprogramming or replacing a DRAM program complicates upgrading and increases costs.

Therefore, a system is needed to automatically detect if the computer has a DRAM, and, if so, to determine the architecture of the DRAM so that the proper protocols can be used. Also, a system is needed to automatically detect the types of DRAM architectures in a computer that have multiple DRAM banks and varying architectures.

SUMMARY OF THE INVENTION

The present invention overcomes limitations of the prior art by providing a system for automatically detecting whether a computer has a DRAM, and, if so, the architecture of the DRAM. The system recognizes Fast Page (FP) architecture, Extended Data Out (EDO) architecture, and Burst Extended Data Out (BEDO) architecture. The three architectures function according to similar WRITE and refresh protocols, but different READ protocols. The DRAM architectures can be identified by their differing READ protocol characteristics.

The present invention advantageously enables upgrading the DRAM without replacing or reprogramming the DRAM program. Also, the system enables computer manufacturers to place into a computer DRAM slot a DRAM having mixed architecture banks, without being concerned that the computer is programmed incorrectly.

The DRAM autodetection system writes known data to DRAM data locations, and then attempts using the FP READ protocol to read the data back. By comparing the data read against the data written, the DRAM autodetection system determines whether the DRAM has a BEDO-type architecture, one of an FP or EDO type architecture, or is faulty, unrecognizable or nonexistent.

The DRAM autodetection system determines whether the DRAM implements a BEDO READ protocol by determining whether the DRAM needs a lead-off signal. If the DRAM autodetection system determines that the DRAM does not have a BEDO architecture, then it determines which between the FP and the EDO architectures the DRAM has by testing whether data can still be read out of the DRAM after the CAS signal has been de-asserted. If the DRAM stops driving out data, the DRAM has an FP architecture. If the DRAM continues driving out data, the DRAM has an EDO architecture. The BEDO autodetection function disables faulty and unrecognizable DRAMs.

BRIEF DESCRIPTION OF THE DRAWINGS

FIG. 4 is a table illustrating data retrieved from DRAM locations based on the operation of the BEDO autodetection routine;

DETAIL DESCRIPTION OF THE PREFERRED EMBODIMENT

Figure 1:
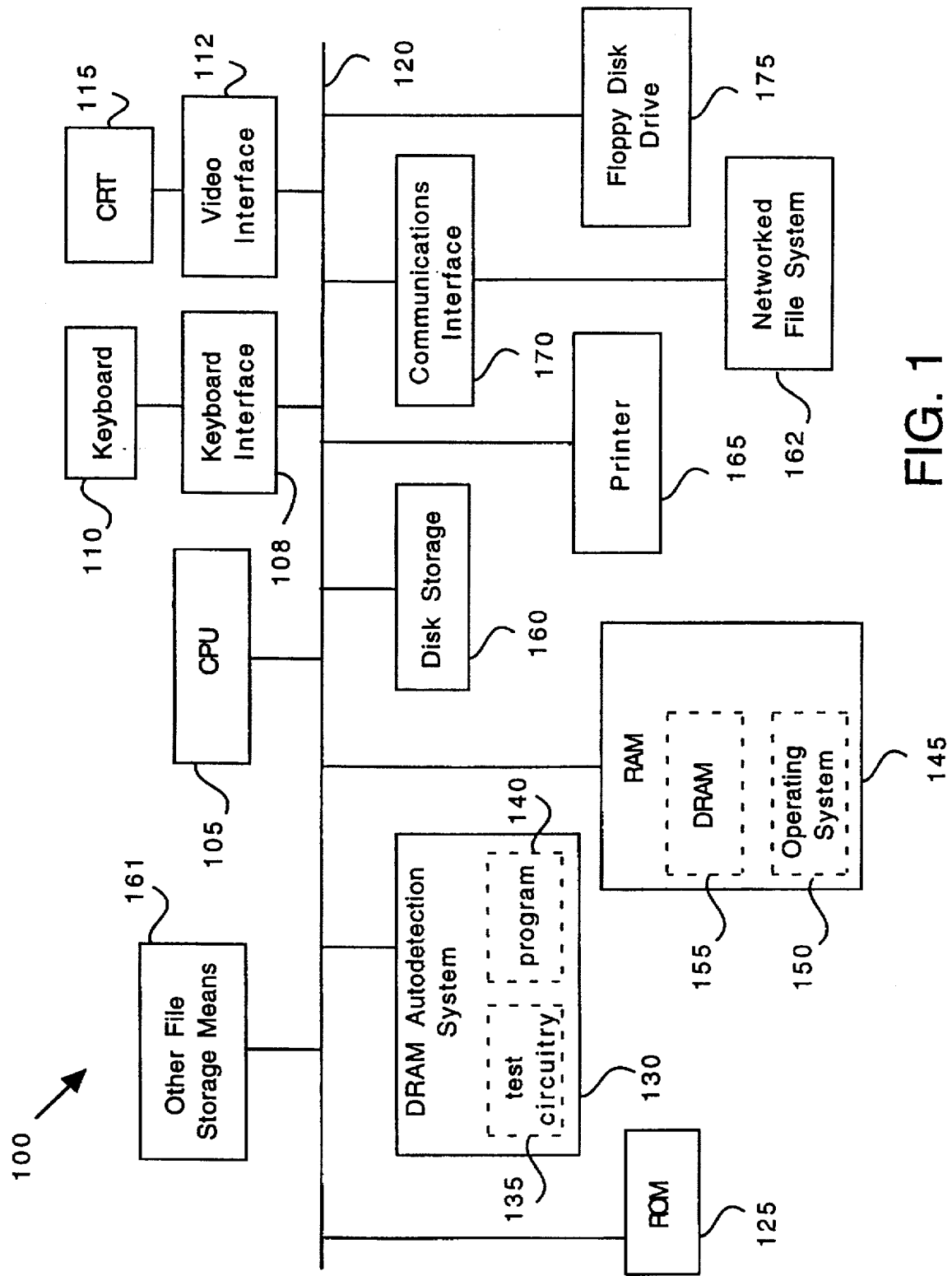
FIG. 1 is a block diagram of a computer system including a DRAM autodetection system according to the present invention.

FIG. 1 is a block diagram of a computer system 100, preferably a microprocessor-based computer system such as an IBM® PC, or a Macintosh® Computer from Apple Computer, Inc. of Cupertino, Calif. Other computer systems also fall within the spirit and scope of this invention. System 100 includes a CPU 105 coupled to a signal bus 120 in turn coupled to input/output devices, such as via keyboard interface 108 to a keyboard 110 and via video interface 112 to a CRT 115. CPU 105 is also coupled to Read Only Memory (ROM) 125 used for initializing the system at power up, DRAM autodetection system 130 according to the present invention, Random Access Memory (RAM) 145 and disk storage 160. RAM 145 normally includes a Dynamic Random Address Memory (DRAM) 155. An operating system program 150 controls the processing of CPU 105, and is normally loaded into RAM 145. CPU 105 may be coupled to other file storage means 161. Computer system 100 may also include a printer 165, a communications interface 170, and a floppy disk drive 175 coupled by signal bus 120 to CPU 105. Communications interface 170 may be coupled to a networked file system 162.

Figure 2:
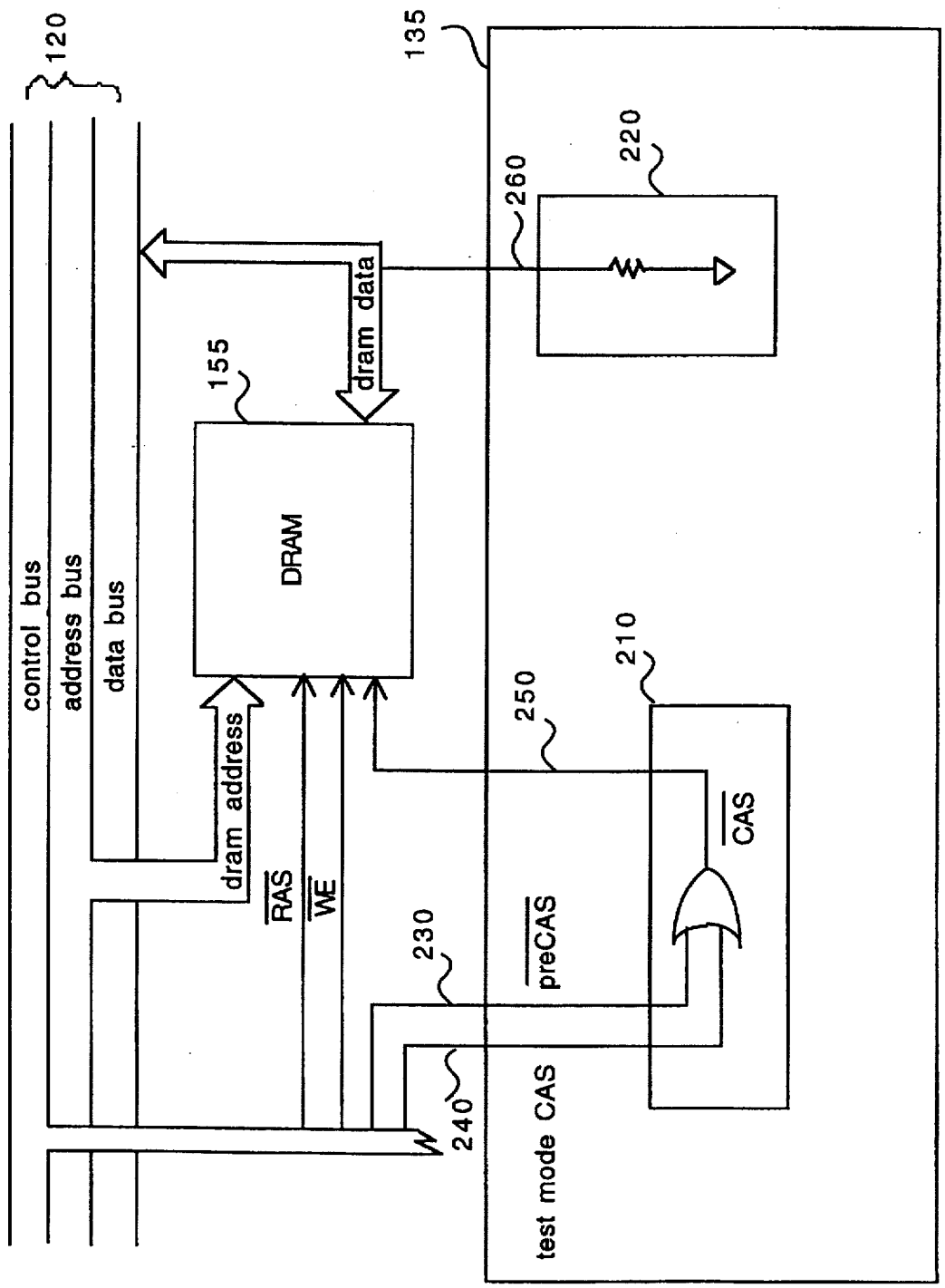
FIG. 2 is a block diagram of the test circuitry of the DRAM autodetection system, including logic level forcing means and CAS signal de-asserting means.
Figure 3:
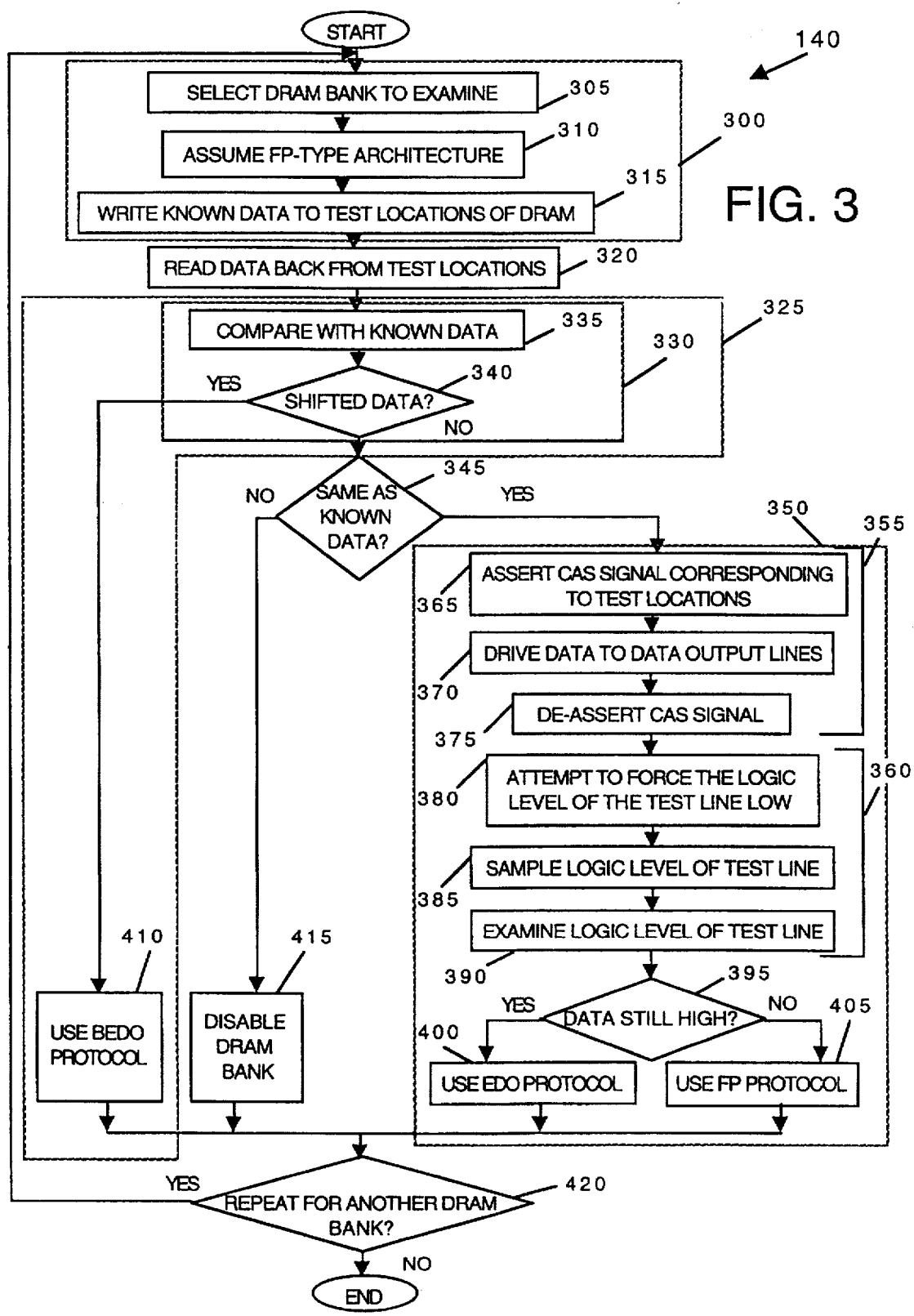
FIG. 3 is a flowchart illustrating the method of the DRAM autodetection system, including the BEDO autodetection routine and the FP/EDO autodetection routine.

DRAM autodetection system 130 comprises test circuitry 135 as detailed in FIG. 2 and a program 140 as described in FIG. 3. Program 140 typically is stored in the initialization ROM, and executed there by CPU 105. Alternatively, program 140 could be stored on a removable floppy disk using floppy disk drive 175, stored on hard disk 160, networked file system 162 or other file storage means 161, and loaded into RAM memory 145 prior to execution by CPU 105. Program 140 controls CPU 105 to determine whether RAM 145 includes a DRAM 155, and if so what the architecture of the DRAM is. Test circuitry 135 is used in determining whether DRAM 155 has an FP or an EDO architecture.

FIG. 2 is a block diagram illustrating preferred test circuitry 135 in DRAM autodetection system 130, including CAS signal de-asserting circuit 210 connected to control lines of bus 120, and logic level forcing circuit 220 connected to data lines of bus 120.

Circuit 210 enables the autodetection system to controllably de-assert the CAS signal. Given that DRAM 155 uses an active low CAS signal on line 250, the conventional "preCAS" signal on line 230 is applied to one input of an OR-gate 210, and an active high "test mode CAS" signal generated by CPU 105 under control of DRAM autodetection program 140 on line 240 is applied to another input. When DRAM autodetection system 130 is inactive, the test mode CAS signal on line 240 is held at logic level low, and the PreCAS signal on line 230 determines the level of the CAS signal on line 250. If either preCAS signal input line 230 or test mode CAS signal input line 240 is raised to a high logic level, the CAS signal is raised, and thus de-asserted on output line 250. When DRAM autodetection system 130 is active, it generates a high test mode CAS signal on line 240 to de-assert the active low CAS signal.

Circuit 220 enables the autodetection system to load a data output line 260. Logic level forcing circuit 220 includes a pull-up or as shown a pull-down resistor R coupled to one of the data output lines 260 (hereinafter "test line") of DRAM 155. For simplicity, logic level forcing circuit 220 is discussed as including a pull-down resistor R, and test line 260 is discussed as being coupled to the least significant bit (i.e. bit 0) data output line of DRAM 155. Additional pull-up/pull-down resistors could be placed on other lines and used in auto detection, but are not necessary. The resistor R resistance is preferably at least 100 KΩ to minimize undesirable effects such as increasing I/O switching time, but other resistance values could be used. Thus, when DRAM 155 is not driving data out to test line 260, logic level forcing circuit 220 eventually forces the test line to a low logic level.

The physical characteristics of a DRAM, and of the wire connecting it to the DRAM controller or CPU implies a small amount of capacitance. Each DRAM contributes 5–10 pf of capacitance on a dataline. If there are several banks, the load due to the DRAM is "#banks * 10 pf". The wire and DRAM controller or CPU contribute additional capacitance. A worst-case capacitive load of 150 pf is assumed for an example, although it could be higher or lower depending on the requirements and constraints of a particular design.

The existence of a capacitive load on test line 260 combined with the resistance of forcing circuit 220 will require a finite amount of time to discharge to a low logic level, described by the time constant $\tau=RC$. The discharge time from initial high to low (or 0.2 of initial voltage) is specified by $-\tau*\ln(0.2)$. The above example of R=100 KΩ and C=150 pf thus has a discharge time of about 25 µs on example test line 260. The maximum cycle period as determined by the manufacturers of DRAMs is about 100 µs, leaving 75 µs during which the test line logic level can be sampled easily. To assure the logic level forcing circuit 220 time enough to pull the logic level low if DRAM 155 is an FP-type and therefore not driving out data, DRAM autodetection system 130 preferably waits about 30–50 µs after de-asserting the CAS signal before sampling the test line logic level.

FIG. 3 is a flowchart of the preferred method in terms of a DRAM autodetection system program 140 according to the invention for determining whether RAM 145 includes a DRAM 155, and if so whether DRAM 155 has a BEDO, FP, or EDO architecture. Program 140 includes test data writing function 300, reading function 320, BEDO autodetection function 325, FP/EDO autodetection function 350, and disabling function 415.

The method starts with test data writing function 300, which controls CPU 105 to write known data to DRAM locations. Writing function 300 selects (step 305) a DRAM bank to examine, and assumes (step 310) that RAM 145 includes a DRAM 155 with an FP architecture. The number of DRAM locations to be written preferably equals the number of locations read by a BEDO-type DRAM burst READ operation, which for a 32-bit DRAM bank, is four transfers of 32 bits each (total 128 bits). Known data is then written (step 315) to four predetermined test location addresses in the DRAM. Writing function 300 preferably writes to row 0 of the data locations in DRAM 155 the following data:

1. FFFFh at address 0;
2. AAAAh at address 4;
3. 5555h at address 8; and
4. 0000h at address C.

Reading function 320 controls CPU 105 to attempt reading these four words individually. Reading function 320 waits until row 0 has been refreshed and then disables the DRAM refresh operation and any DRAM inactivity time-outs before reading the data words. When assuming that DRAM 155 has an FP-type architecture, reading function 320 does not provide a lead-off signal. Data is read back (step 320) sequentially and compared (step 330) with the known data.

BEDO autodetection function 325 controls CPU 105 to determine whether DRAM 155 has a BEDO architecture. Since the BEDO READ protocol includes transmission of a lead-off signal which does not involve data transfer, and the FP and EDO READ protocols do not, BEDO autodetection function 325 determines whether DRAM 155 needs such a lead-off signal. If DRAM 155 has a BEDO-type architecture, the data read by reading function 320 will not match the data written by writing function 300 on corresponding clock cycles. Instead, the data read from address locations 0, 4, 8, and C will be garbage, FFFFh, AAAAh and 5555h, respectively, as shown in FIG. 4. The data read from address location 0 is garbage because a BEDO-type DRAM 155 latches the requisite lead-off signal and does not drive out data on the first clock cycle, and meanwhile the DRAM 155 tri-stated output garbage is sampled as the first read word. Then, delayed by one read clock cycle, reading function 320 samples the first three written words as described below with reference to FIGS. 4 and 5.

The data read by reading function 320 is examined (step 335) by CPU 105 under control of comparing function 330. In step 340, if the known written data words 1-3 match words 2-4 read back from the test locations, then they have been delayed one read cycle and DRAM 155 has a BEDO-type architecture. If for example the data read from address location 4 is FFFFh, then data has been delayed one read cycle, and BEDO protocols will be used (step 410) for the selected DRAM bank.

If the data read back does not match the shifted data read in, then in step 345, if the data read back matches the unshifted data read in (i.e. the data read from address location 4 is AAAAh, the same as the data written), then DRAM 155 has one of either an FP or an EDO architecture, and autodetection program 140 proceeds to FP/EDO autodetection function 350, which controls CPU 105 to distinguish between these two architectures.

FP/EDO autodetection function 350 comprises address assertion function 355, reading function 360 and comparing function 395. Address assertion function 355 controls CPU 105 to set up an FP/EDO test mode which asserts a CAS signal on line 230 to DRAM 155 for retrieving data (FIG. 4) stored by test data writing function 300. Since the logic level forcing circuit 220 (FIG. 2) is a pull-down type, address assertion function 355 strobes (step 365) an address signal corresponding to a test location, for example address 0, storing a word having a high order bit that is retrieved on a particular test line 260. In step 370, DRAM 155 drives from the test locations data FFFFh including the pre-existing high level=1 in bit 0 connected to test line 260. During the assertion of the CAS signal both FP and EDO type DRAMs 155 drive data out, but after the CAS signal is de-asserted an FP-type DRAM 155 stops while an EDO-type DRAM 155 continues driving data out. The CPU 105 then generates an active high test mode CAS signal on line 240 to OR gate 210 which de-asserts (step 375) the CAS signal on line 250. If DRAM 155 has an FP-type architecture, it will stop driving the data bit=1 to test line 260.

Reading function 360 controls CPU 105 to sample the data, including the data at bit 0, read from DRAM 155. Although after the CAS signal is de-asserted an FP-type DRAM 155 stops driving data out, DRAM output lines have capacitances and maintain valid data values for some finite time. Logic level forcing circuit 220 attempts (step 380) to force the test line logic level low. If DRAM 155 has stopped driving data out, pull-down resistor R of logic level forcing circuit 220 will force the test line 260 logic level to low. If DRAM 155 has an EDO architecture, DRAM 155 continues driving data to test line 260, and the logic level remains high. Either CPU 105 or the DRAM controller auto detection test logic allows the passage of a pause long enough (30 to 50 µs) for test line 260 to discharge. Then, the test line 260 logic level is sampled (step 385) and tested (step 390) to determine whether the data value remains valid.

Comparing function 395 controls CPU 105 to compare the sampled data from address 0 against the data FFFFh. If the data sampled is FFFFh, then bit 0 was not forced low and DRAM 155 has an EDO architecture; therefore, EDO protocols will be used (step 400) for this DRAM bank. If the data sampled is not FFFFh, then bit 0 was forced low and DRAM 155 has an FP architecture; therefore, FP protocols will be used (step 405). The value read depends on where the pull-down resistor(s) are placed on the DRAM 155 data line(s). In the example of a single pull-down resistor placed on bit 0, the value read would be FFFEh.

In step 345, if the data read back does not match the shifted or unshifted known data (i.e. if the data read from address location 4 is neither FFFFh nor AAAAh), then either DRAM 155 is faulty or unrecognizable, or there is no DRAM 155 in RAM 145. Only one of the addresses 4, 8 and C data needs to be examined to determine whether words have been delayed one address cycle, but it is preferable to examine data at two addresses for confirmation. If there is a faulty or unrecognizable DRAM bank, disabling function 415 uses interrupts, configures a disable bit within the DRAM controller logic to redirect accesses to the DRAM bank, or provides inactivity time-outs to control CPU 105 to disable the DRAM 155.

After either determining to use the BEDO protocol (step 410), the EDO protocol (step 400), or the FP protocol (step 405), or disabling the DRAM bank (no protocol, step 415), the method proceeds to step 420. If there is another DRAM bank 155 to be identified (step 420) then the autodetection function repeats the process. When all banks have been analyzed, the method ends.

FIG. 4 is a table illustrating data words written to a DRAM 155 and their relation, depending on the DRAM type, to the data words read back on corresponding read/write cycles. As shown in column 1, test data writing function 300 writes the data words FFFFh, AAAAh, 5555h, and 0000h to DRAM locations at addresses 0, 4, 8, and C, respectively. Reading function 320 assumes DRAM 155 has an FP or EDO architecture in reading the data words from these locations. As shown in column 2, if DRAM 155 has a BEDO architecture, the retrieved data is garbage, FFFFh, AAAAh, and 5555h, respectively. As shown in column 3, if DRAM 155 has an FP or EDO architecture, the retrieved data is the same as the data written to DRAM 155. As shown in column 4, if RAM 145 does not include a DRAM 155, or DRAM 155 is faulty or unrecognizable, neither the column 2 nor the column 3 data word pattern will be read.

Figure 5:
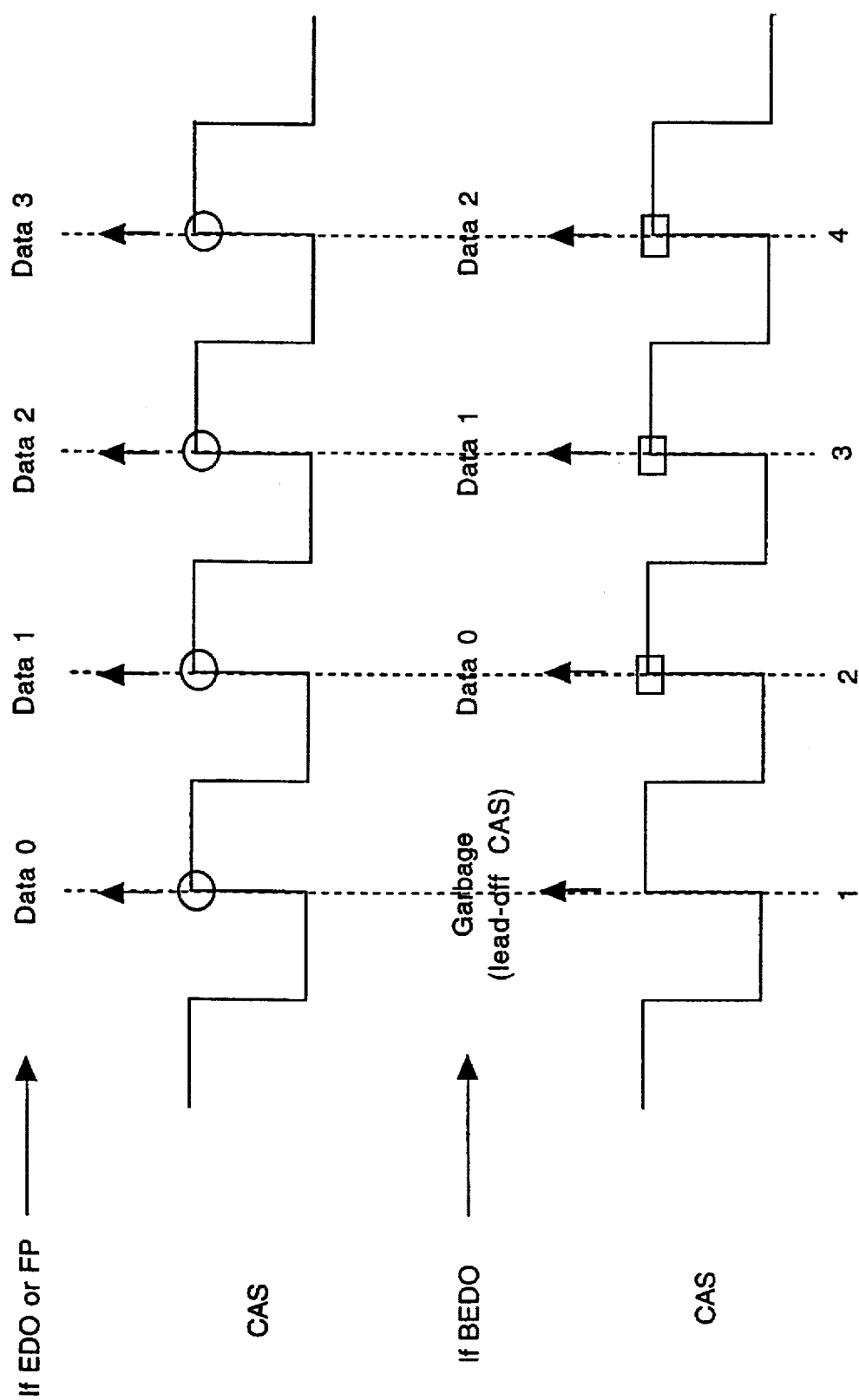
FIG. 5 is a timing diagram for the BEDO autodetection routine.

FIG. 5 is a timing diagram illustrating data read from the four locations in a DRAM based on the BEDO vs. (EDO or FP) architecture type. Four DRAM locations store DATA 0, DATA 1, DATA 2, and DATA 3. Reading function 320 performs individual READ operations at four rising edges of the CAS strobe signal. If DRAM 155 has an EDO or FP architecture, then the data retrieved is DATA 0, DATA 1, DATA 2 and DATA 3. Alternatively, if DRAM 155 has a BEDO architecture, then on the first CAS strobe pulse it latches the address (lead-off) signal and does not drive data out, so the signal on data bus 120 is garbage. After latching the lead-off signal, on the second, third and fourth CAS strobe pulses DRAM 155 drives out DATA 0, DATA 1, and DATA 2. Thus, the data read out of BEDO-type DRAM 155 is delayed one CAS strobe pulse compared to an EDO or FP type DRAM.

Figure 6:
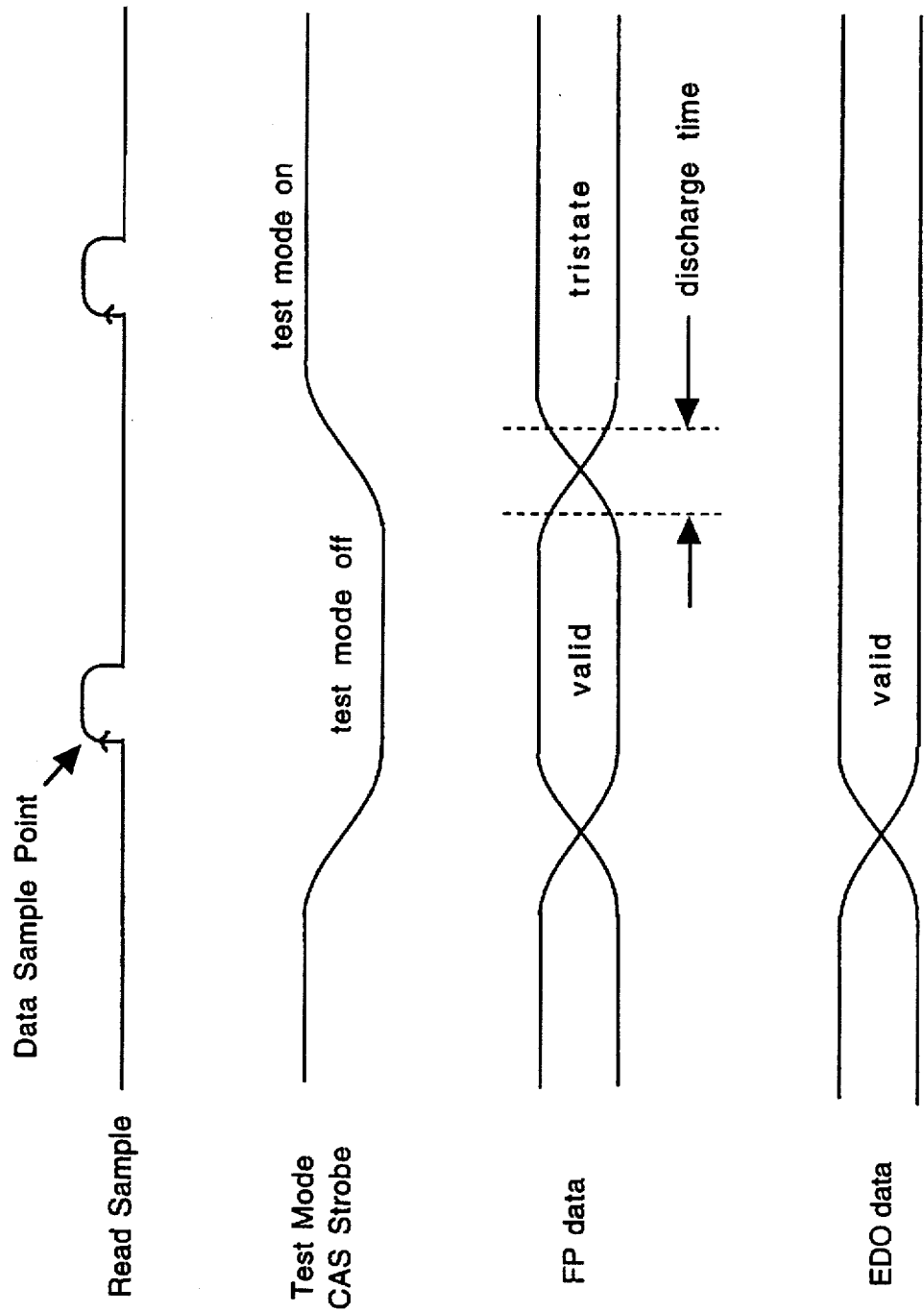
FIG. 6 is a timing diagram for the FP/EDO autodetection routine.

FIG. 6 is a timing diagram for the FP/EDO autodetection function 350, illustrating the READ operation (step 360) results while the test mode (step 355) is "off" and "on." While the test mode is "off" (step 365) the CAS signal is asserted and (step 370) both FP-type DRAM and EDO-type DRAMs drive valid logic level data out. While the test mode is "on" (step 375) the de-asserted CAS signal "tri-states" FP-type DRAM 155 and stops it from driving data out to line 260. With FP-type DRAM 155 tri-stated, a pull-down (or pull-up) resistor R of circuit 220 lines in one discharge time forces the test line 260 to an opposite, invalid logic level. Thus, from the logic level of the data line, the architecture of DRAM 155 is determined by FP/EDO autodetection function 350.

Variations of the preferred embodiments are also provided by the present invention. For example, although DRAM 155 is discussed as a singular bank, RAM 145 may have several DRAM banks, and DRAM autodetection system 130 tests each DRAM bank separately. Also, although DRAM autodetection system 130 is described as including software, the system can be implemented in hardware. The embodiments described herein are illustrative and are not intended to be exhaustive. The spirit and scope of the invention are to be limited only by the following claims.

What is claimed is:

1. A method of determining an architecture of a dynamic random access memory (DRAM) bank from a set of architectures including fast page (FP) architecture, extended data out (EDO) architecture, and burst extended data out (BEDO) architecture, comprising the steps of:

selecting a DRAM bank to examine;

writing a first predetermined word to a first memory location in the DRAM bank, and a second predetermined word to a second memory location which is sequential to the first memory location;

reading from the first and separately reading from the second memory locations to obtain a first read word and a second read word respectively; and comparing the second read word with the first predetermined word, and if the second read word matches the first predetermined word, then indicating that the architecture of the selected DRAM bank is a BEDO architecture.

2. The method recited in claim 1, wherein the step of comparing the second read word with the first predetermined word further comprises the step of comparing the second read word with the second predetermined word, and if the second read word equals the second predetermined word, then concluding that the architecture of the DRAM bank is an architecture from the group consisting of FP and EDO architectures.

3. The method recited in claim 2 further comprising, after the step of comparing, the step of disabling the DRAM bank if the second read word is different from the first and the second predetermined words.

4. The method recited in claim 2 wherein the DRAM bank has a data output line, and further comprising the steps of, if the DRAM bank architecture is one of the FP and EDO architectures, then:

forcing the data output line to a first logic level when the DRAM bank stops driving data signals at a second logic level to the data output line; and examining the logic level of the data output line, and if the logic level is at the first logic level, then concluding that the DRAM bank architecture is an FP architecture, and if the logic level is at the second logic level, then concluding that the DRAM bank architecture is an EDO architecture.

5. The method recited in claim 4, wherein the step of forcing the data output line uses a pull-down resistor to force the output line to a low first logic level.

6. The method recited in claim 4, wherein the step of forcing the data output line uses a pull-up resistor to force the output line to a high first logic level.

7. The method recited in claim 4, further comprising the step of de-asserting a column address strobe (CAS) signal a time interval sufficient to permit electrical discharge of a test signal before the step of examining the logic level; the time interval being established by taking the worst case capacitive load due to devices on a given DRAM data line multiplied by the resistance of a pull-up/pull-down resistor in the equation $t=-RC*\ln(Vfinal/Vinitial)$, where Vfinal/Vinitial is typically 0.2.

8. The method recited in claim 1, wherein the step of writing includes writing third and fourth predetermined words to third and fourth sequential memory locations.

9. The method recited in claim 1 wherein the step of reading is an FP-type READ operation.

10. A system for determining an architecture of a dynamic random access memory (DRAM) bank from a set of architectures including fast page (FP) architecture, extended data out (EDO) architecture, and burst extended data out (BEDO) architecture, comprising:

test data writing means for writing first and second predetermined words respectively to first and second locations in the DRAM;

reading means for reading a first and separately reading a second read word respectively from the first and second locations in the DRAM; and comparator means for comparing the second read word with the first predetermined word, and if the second read word matches the first predetermined word, then indicating that the DRAM bank architecture is a BEDO architecture.

11. The system recited in claim 10, wherein the comparator means further compares the second read word with the second predetermined word, and if the second read word matches the second predetermined word, then indicates that the DRAM bank architecture is one from the set of FP and EDO architectures.

12. The system recited in claim 11, further comprising disabling circuit means for disabling the DRAM bank if the second read word is different from the first and second predetermined words.

13. The system recited in claim 11, further comprising a DRAM bank data output line, and logic level forcing means coupled to the data output line for forcing the logic level of the data output line to a first logic level when the DRAM bank stops driving data signals to the data output line.

14. The system recited in claim 13, further comprising address assertion means for asserting a row address strobe (RAS) signal and a column address strobe (CAS) signal while a write enable (WE) signal is de-asserted to the DRAM bank to read from a preselected location in the DRAM bank.

15. The system recited in claim 14, wherein the preselected location in the DRAM includes a plurality of bit storage locations, and stores data at a second logic level, different than the first logic level, at a bit storage location connected to the data output line.

16. The system recited in claim 15, wherein the address assertion means is also the CAS de-assertion signal means.

17. The system recited in claim 16, wherein if the DRAM bank has an FP architecture, then when the CAS signal is de-asserted, the DRAM bank stops driving data to the data output line, which is therefore forced by the logic level forcing means to the first logic level.

18. The system recited in claim 16, wherein if the DRAM bank has an EDO architecture, then when the CAS signal is de-asserted, the DRAM bank continues driving data to the data output line, which therefore remains at the second logic level.

19. The system recited in claim 15, wherein the logic level forcing means comprises a resistor coupled to the data output line.

20. The system recited in claim 19, wherein the logic level forcing means takes into account the intrinsic capacitance of the DRAM, wiring, other devices on the DRAM data lines, and the resistor to determine a discharge time of the data output line.

21. The system recited in claim 20, further comprising a comparator, and wherein the address assertion means also controls the de-assertion of the CAS signal, and after the discharge time the comparator samples the logic level of the data output line and compares the logic level of the data output line with the first and second logic levels.

22. The system recited in claim 15, wherein the logic level forcing means comprises a pull-down resistor coupled to the data output line, and the first logic level is logic level low.

23. The system recited in claim 15, wherein the logic level forcing means comprises a pull-up resistor coupled to the data output line, and the first logic level is logic level high.

24. A program storage device having a computer program stored therein for causing a computer to perform the steps of:

selecting a dynamic random access memory (DRAM) bank to examine;

writing a first predetermined word to a first memory location in the DRAM bank, and a second predetermined word to a second memory location which is sequential to the first memory location;

reading from the first and separately reading from the second memory locations to obtain a first read word and a second read word respectively; and comparing the second read word with the first predetermined word, and if the second read word is the same as the first predetermined word, then concluding that an architecture of the selected DRAM bank is a burst extended data out (BEDO) architecture.

* * * * *